United States Patent [19]
Chotard et al.

[11] Patent Number: 5,339,220
[45] Date of Patent: Aug. 16, 1994

[54] HOST STRUCTURE FOR ADAPTORS FOR TERMINALS BELONGING TO A DISTRIBUTED DATA PROCESSING ARCHITECTURE

[75] Inventors: Antoine Chotard, Villepreux; Jean-Jacques Belloir, Echirolles; Thierry Iceta, Saint-Martin-Le-Vinoux, all of France

[73] Assignee: Bull, S.A., Paris, France

[21] Appl. No.: 920,321

[22] PCT Filed: Dec. 19, 1991

[86] PCT No.: PCT/FR91/01038
§ 371 Date: Aug. 19, 1992
§ 102(e) Date: Aug. 19, 1992

[87] PCT Pub. No.: WO92/11744
PCT Pub. Date: Jul. 9, 1992

[30] Foreign Application Priority Data
Dec. 20, 1990 [FR] France .................. 90 16032

[51] Int. Cl.⁵ .................. H05K 7/14; H05K 5/00
[52] U.S. Cl. .................. 361/796; 361/752; 361/753; 361/797
[58] Field of Search ............ 361/392, 393, 394, 399, 361/412, 413, 415, 752, 753, 796–800, 810; 439/44, 61; 211/41

[56] References Cited
U.S. PATENT DOCUMENTS

| | | | |
|---|---|---|---|
| 4,899,254 | 2/1990 | Ferchau et al. | 361/415 |
| 5,027,254 | 6/1991 | Corfits et al. | 361/415 |
| 5,103,378 | 4/1992 | Stowers et al. | 361/415 |

FOREIGN PATENT DOCUMENTS

| | | | |
|---|---|---|---|
| 0129883 | 1/1985 | European Pat. Off. | 361/415 |
| 0262685 | 4/1988 | European Pat. Off. | |
| 0345493 | 12/1989 | European Pat. Off. | |
| 62-117399 | 5/1987 | Japan | 361/384 |

OTHER PUBLICATIONS
IBM Disclosure Bulletin "Method For Increasing Volume of Logic Book" vol. 33 No. 6A Nov. 1990.

Primary Examiner—Lincoln Donovan
Assistant Examiner—D. Sparks
Attorney, Agent, or Firm—Kerkam, Stowell, Kondracki & Clarke

[57] ABSTRACT

A host structure (P) is provided for terminal adaptors (AD-AD$_{14}$, SDI) of a distributed information processing architecture (ARCH) having information processing systems (SI, SI$_1$, SI$_j$, ..., SIS$_j$, SAD, ... SAD$_j$) which communicate by way of a network (RE). The host structure (P) includes a first compartment (CAV) containing a plurality of cartridges (1, AD-AD$_{14}$, ADI) each containing a board carrying the electronic circuit of an adaptor, a second compartment (CAR) containing the electrical supply to the boards contained in the first compartment and a ventilation device (VAT) of the structure. The first and second compartments are separated by a backpanel (FP) carrying a copper bus (BCE, BCE$_j$) specific to the network to which the boards carrying the terminal adaptors are connected. The backpanel (FP) includes a CORE (CF-CF$_{14}$) for connecting the boards to the network (RE) and to the bus (BCE), on the one hand, and to the power supply (AIM), on the other.

13 Claims, 10 Drawing Sheets

HOST STRUCTURE FOR ADAPTORS FOR TERMINALS BELONGING TO A DISTRIBUTED DATA PROCESSING ARCHITECTURE

The present invention relates to a host structure for terminal adaptors belonging to a distributed information processing architecture. More particularly, it applies to an architecture that uses a local area network of the type known as Carrier Sense Multiple Access with Collision Detection (often called by its acronym, CSMA/CD). The invention applies more especially to local area networks of the Ethernet or Cheapernet type. In the ensuing text, such networks will be referred to by the general name of Ethernet networks.

Communications networks are constituted of a plurality of units, generally known as data terminal equipment, or DTE. For linguistic simplicity, they are also known as terminals or stations. A computer connected to a network is considered to be a terminal. The terminals communicate with one another via a transmission medium, which may be a coaxial cable, for example, in the case of the Ethernet networks.

Local area networks (LAN) are networks limited to one geographic location of limited area, where the distances between the various stations are on the order of a few meters to a few tens of meters, or may even be as much as several kilometers.

Local area networks of the CSMA/CD type are frequently used by now. They are standardized by the IEEE Committee of the Institute of Electrical and Electronic Engineers, in the form of a standard, 802.3 (adopted by ISO, the International Standards Organization, in the form of ISO Standard 8802.3).

The Ethernet networks have a data transmission rate of 10 Mbits per second, and their standardized transmission medium is a coaxial cable with a characteristic impedance of 50 Ohms.

A computer is known to comprise one or more central processing units, input/output processors, random access memories and read only memories associated with all of these processors, and input/output controllers, on the one hand, and on the other hand, various peripherals such as disk memories or input/output peripherals (terminals with a screen, printers, etc.) that enable the exchange of data with the outside, these peripherals being associated with peripheral controllers.

All of the constituent elements listed above (except for the peripherals) are disposed on a set of boards of standardized dimensions.

The trend in networks in industry, which is to use increasingly more numerous terminals, leads to the development of programmed communications servers at the level of the computers; their role is to reduce the load on the central processing unit of the computer by performing some of the management, on the one hand, of the messages sent by the various constituent elements of the computer to the telecommunications network to which the computer is connected, and, on the other hand, of messages originating in other terminals in the network.

The extremely rapid increase in the power and processing capacity of computer central processing units makes it possible to have an increasingly large number of input/output terminals communicate with the central processing units of the computer. These input/output peripherals are synchronous or asynchronous terminals that communicate with their external environment by way of transmission lines with rates that may range from 300 bits/s to 64 kbits/s. These input/output terminals of a computer communicate with the outside by way of a wide diversity of equipment known as modems (a contraction of the words modulator-demodulator), whose function is to adapt the electrical signal furnished by the input/output terminal to the transmission medium that connects the terminal with its external environment. These modems are defined by CCITT (Comité Consultatif International Télégraphique et Téléphonique) notices V-24, V-28, V-11, V-35, and V-36, for example. These various notices also define the modes of transmission and the protocols in the corresponding transmission links. These links are carried physically by transmission media, which in fact have many separate cables or sets of wires.

Large modern information processing systems, accordingly made up of a computer, its communications server and the various input/output terminals that are connected to it, may include up to several hundred terminals, which are accordingly connected to the computer by an equal number of cables or sets of wires. When the terminals are distributed over a geographic location of limited area, the presence of a large number of cables and wires presents very major mechanical problems, physical problems (crosstalk, etc.) and bulk.

In practice, each information processing system is typically connected to other systems, on the one hand, and to the input/output terminals on the other, by way of an Ethernet network.

The object of the invention is to shift all the transmission media, constituted by these cables or sets of wires, to outside the geographical space occupied by the computer and its communications server. The communications server is then connected to the various terminals by way of a plurality of adaptors, whose function is to adapt the transmission rate and the transmission protocol of the Ethernet network to the rates and protocols used over the various transmission lines belonging to each input/output terminal. To attain this object, a plurality of adaptors is grouped together in the same geographical space, called a host structure, constituted by a backpanel, for instance, and containing a plurality of these adaptors, such as 15 of them, or even more.

The set of adaptors contained in the same host structure constitutes an adaptor system. Naturally, several adaptor systems of this type may be connected to one another, with each adaptor system connected to its neighbor via a coaxial cable whose minimum length is 0.50 m, in accordance with the Ethernet standard.

The same adaptor system may be considered a terminal of the Ethernet network to which it is connected.

The fact that a plurality of adaptors are grouped together in the same host structure makes it possible to avoid connecting each adaptor to its neighbor by a coaxial cable of minimum length $=0.50$ m in accordance with the aforementioned standard. In fact, if the adaptors are physically separate from one another, they are considered as terminals of the Ethernet network and as a result must be connected to one another by coaxial cables having the same maximum length. Hence the invention makes it possible to substantially reduce the space occupied by the adaptors and their transmission media, by reducing the number of transmission media.

According to the invention a host structure for terminal adaptors belonging to a distributed information processing architecture, formed of a plurality of information processing systems, each connected by way of communication serves to a plurality of networks of various types, each system being connected to a plurality of synchronous or asynchronous terminals by way of at least one of the networks and terminal adaptors, each of which is connected on the one hand to said network and on the other to at least one terminal by way of a synchronous or asynchronous transmission link, characterized in that it includes:

a first compartment containing a plurality of cartridges each containing a board carrying the electronic circuit of an adaptor, a second compartment containing the electrical supply to the boards contained in the first compartment and a ventilation device of the structure, the first and second compartments being separated by a backpanel carrying a copper bus specific to the network to which the boards carrying the terminal adaptors are connected, the backpanel including means for connecting the boards to the network and to the bus, on the one hand, and to the power supply, on the other.

Further characteristics and advantages of the present invention will become apparent from the ensuing detailed description, which is given as an illustrative, non-limiting example, taken in conjunction with the drawings.

Figure 7A:
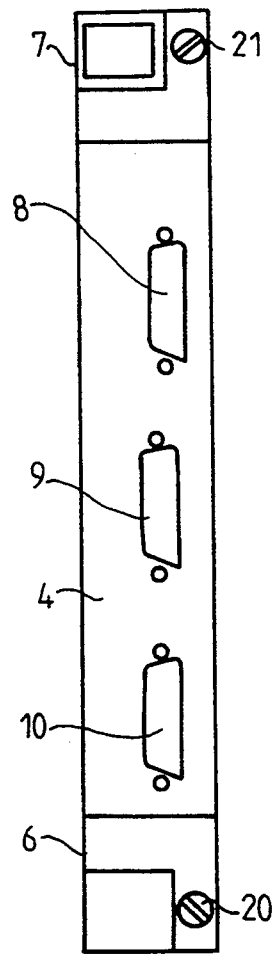
Figure 7B:
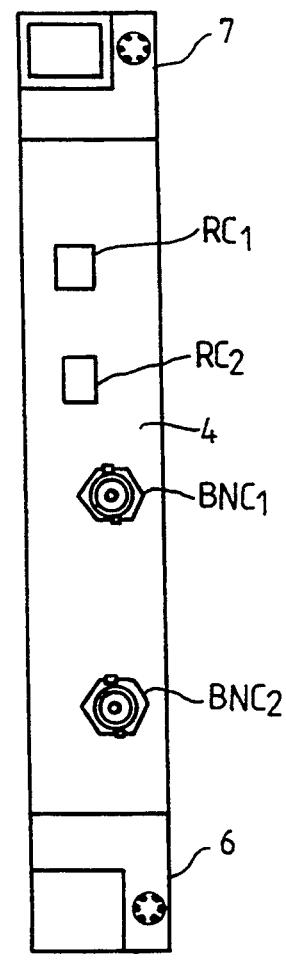
Figure 8:
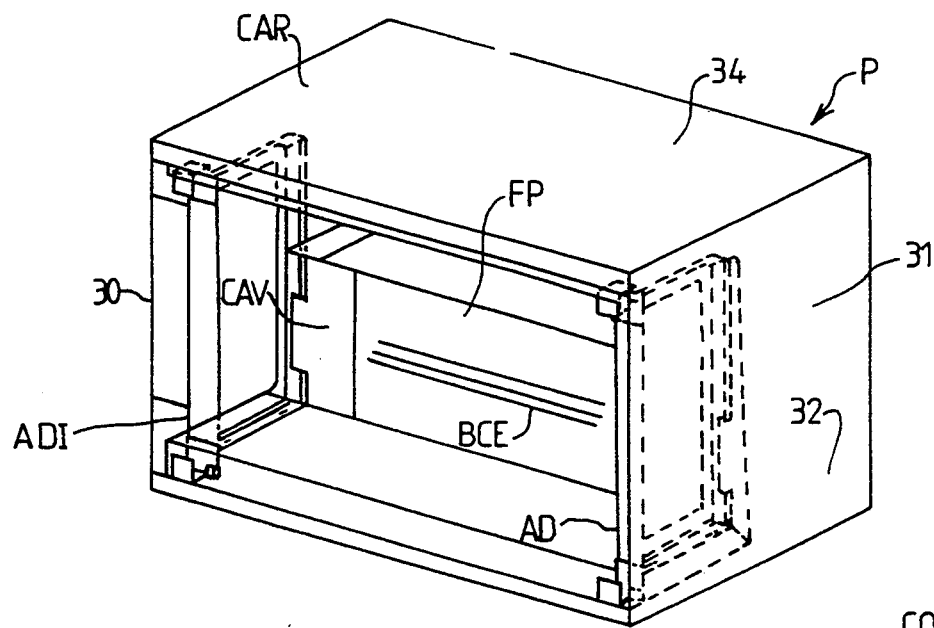
Figure 11A:
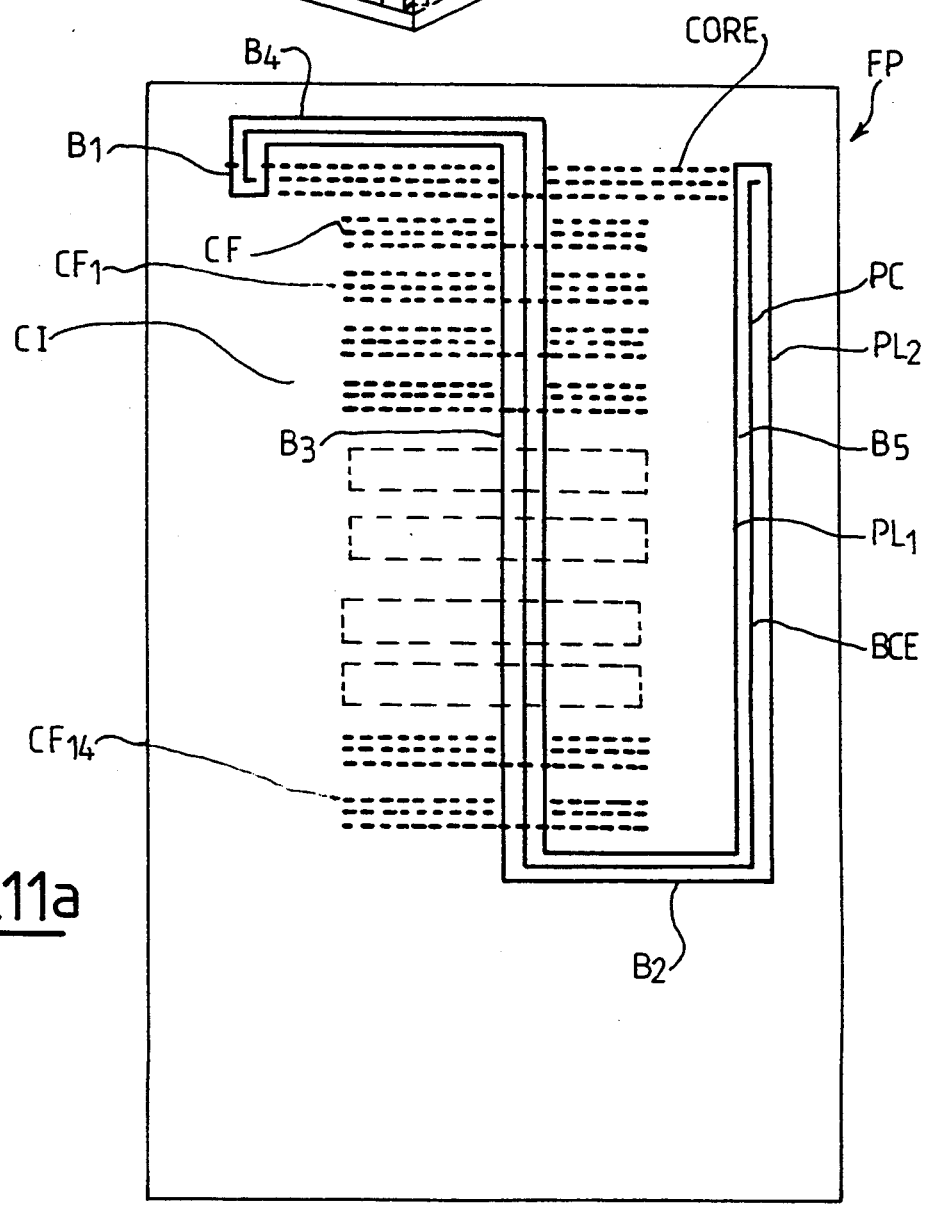
Figure 9:
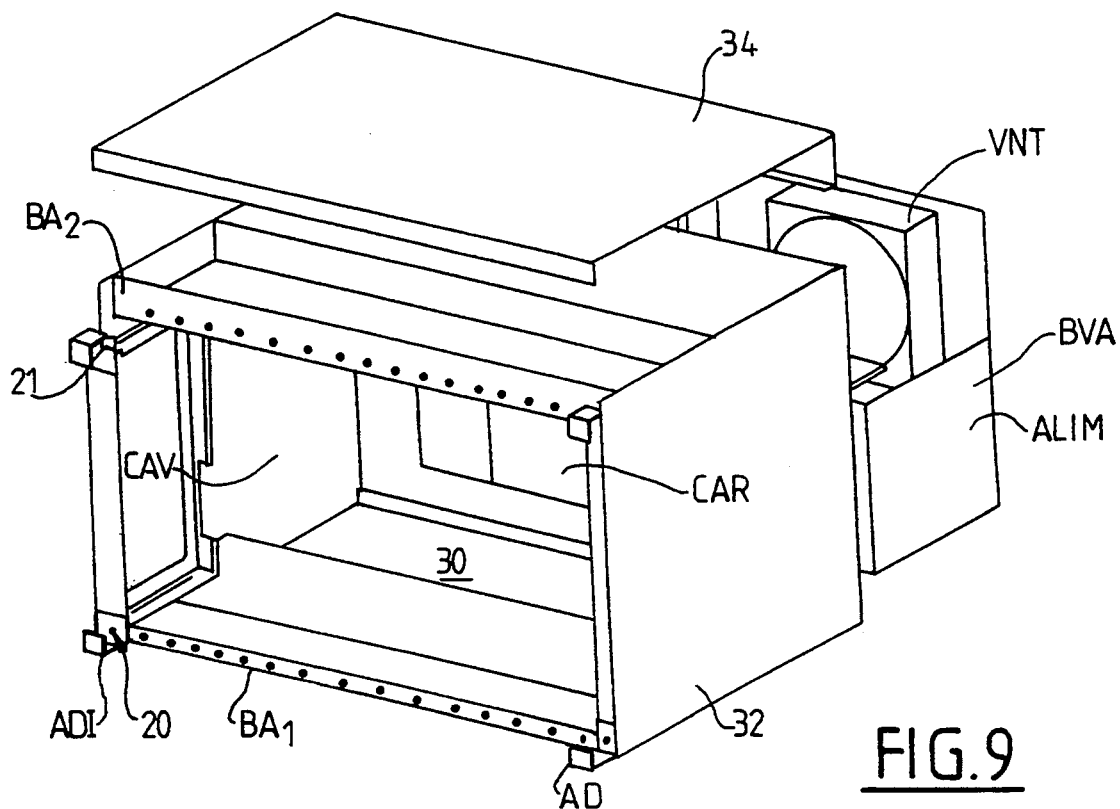
Figure 10:
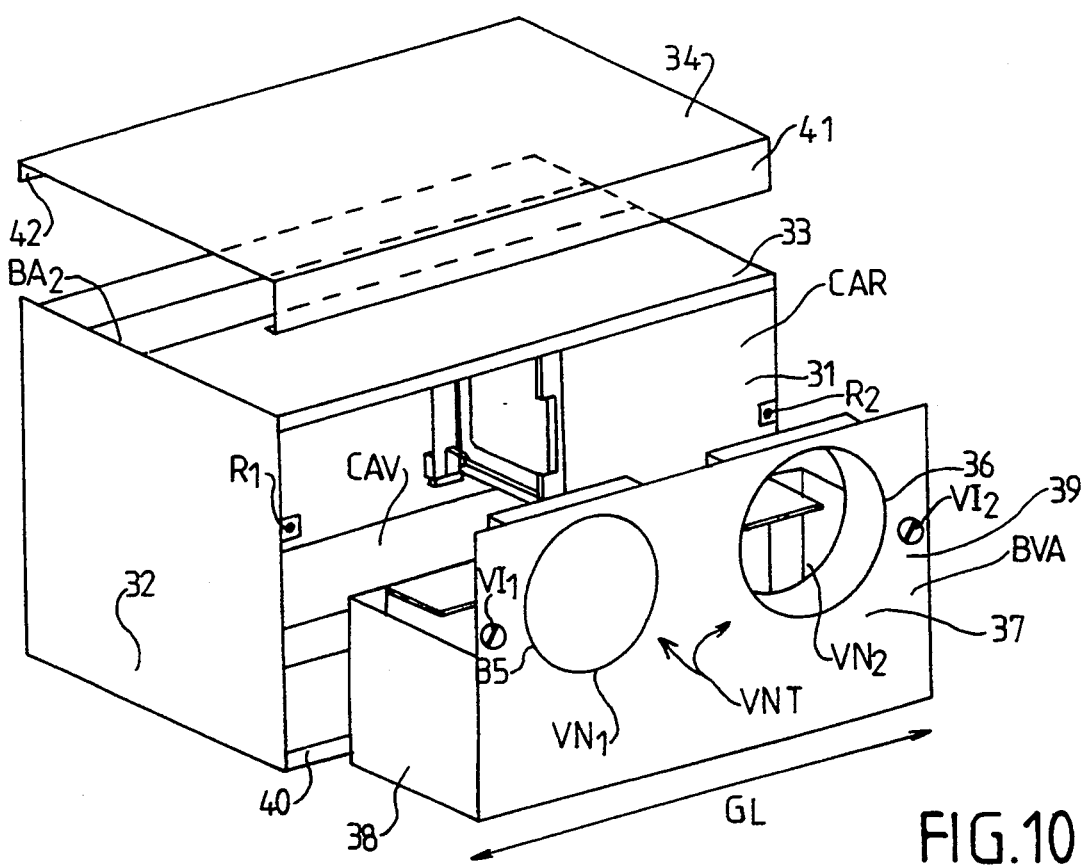
Figure 11B:
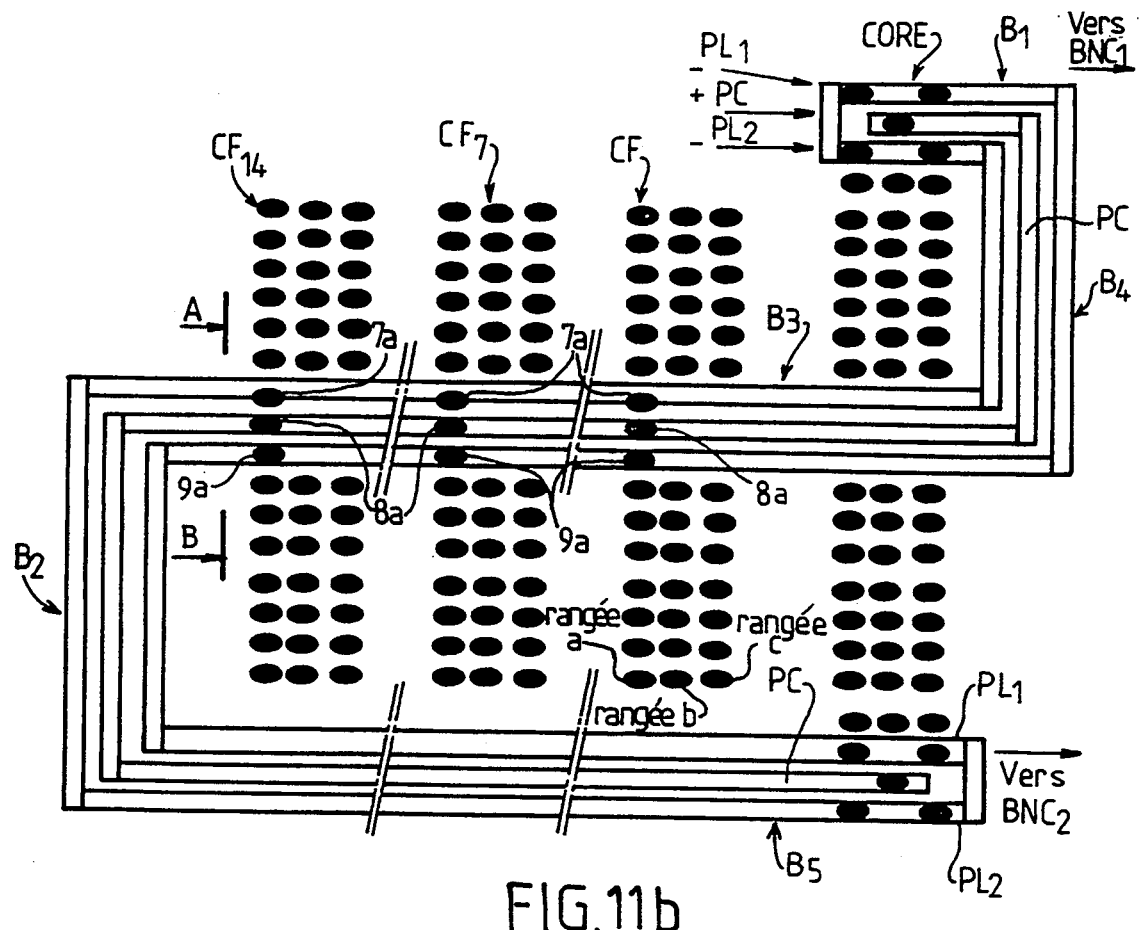
Figure 11C:
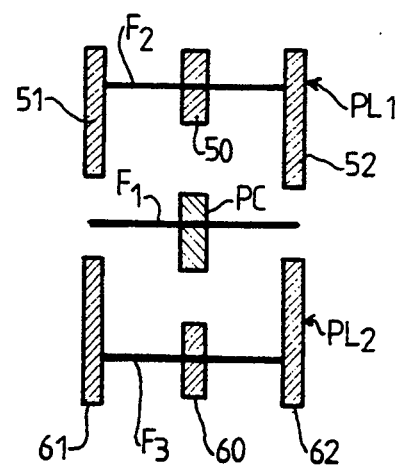
Figure 12:
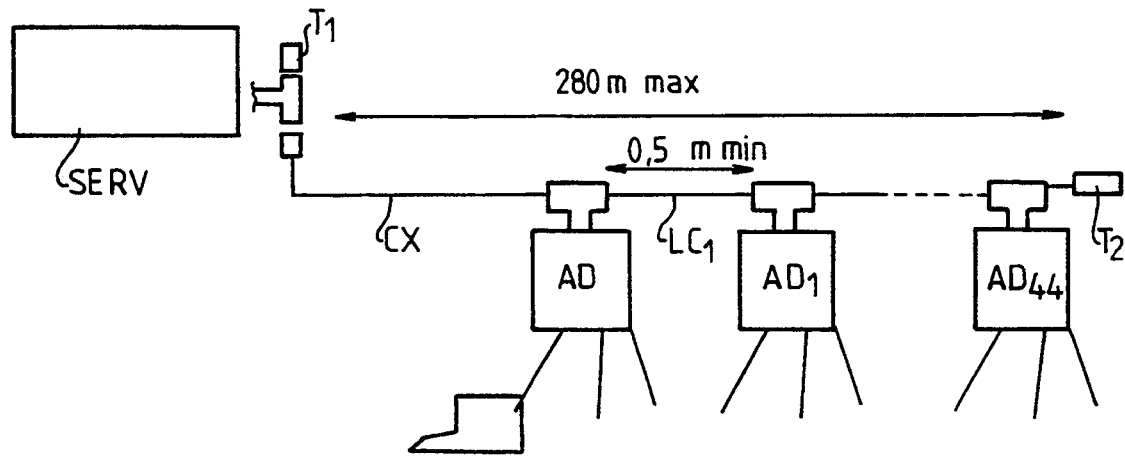
Figure 13:
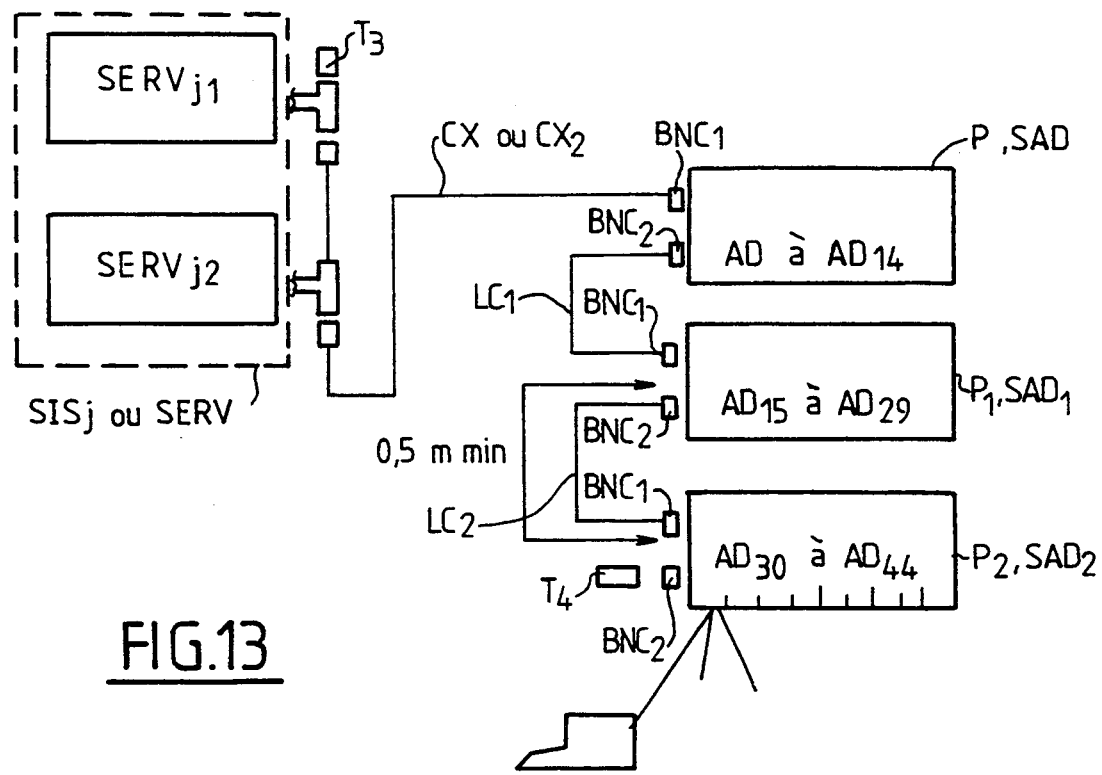

FIG. 7, composed of FIGS. 7a and 7b shows views from the front of two cartridges of different types which may be contained in the host structure of the invention;

FIG. 8 is a front view in ¾ perspective of the host structure of the invention;

FIGS. 9 and 10, in more detail than FIG. 8, are front and back views, respectively, in ¾ perspective of the host structure of the invention;

FIG. 11, comprising the set of three FIGS. 11a, 11b, and 11c, of which 11a and 11b are top views and 11c is a view in cross section, show the backpanel separating the first and second compartments of the host structure of the invention, this backpanel carrying a copper bus of the Ethernet type and the various connectors connecting this bus to the various adaptors contained in the host structure of the invention;

FIGS. 12 and 13 illustrate the advantage of the host structure of the invention over the prior art.

Figure 1:
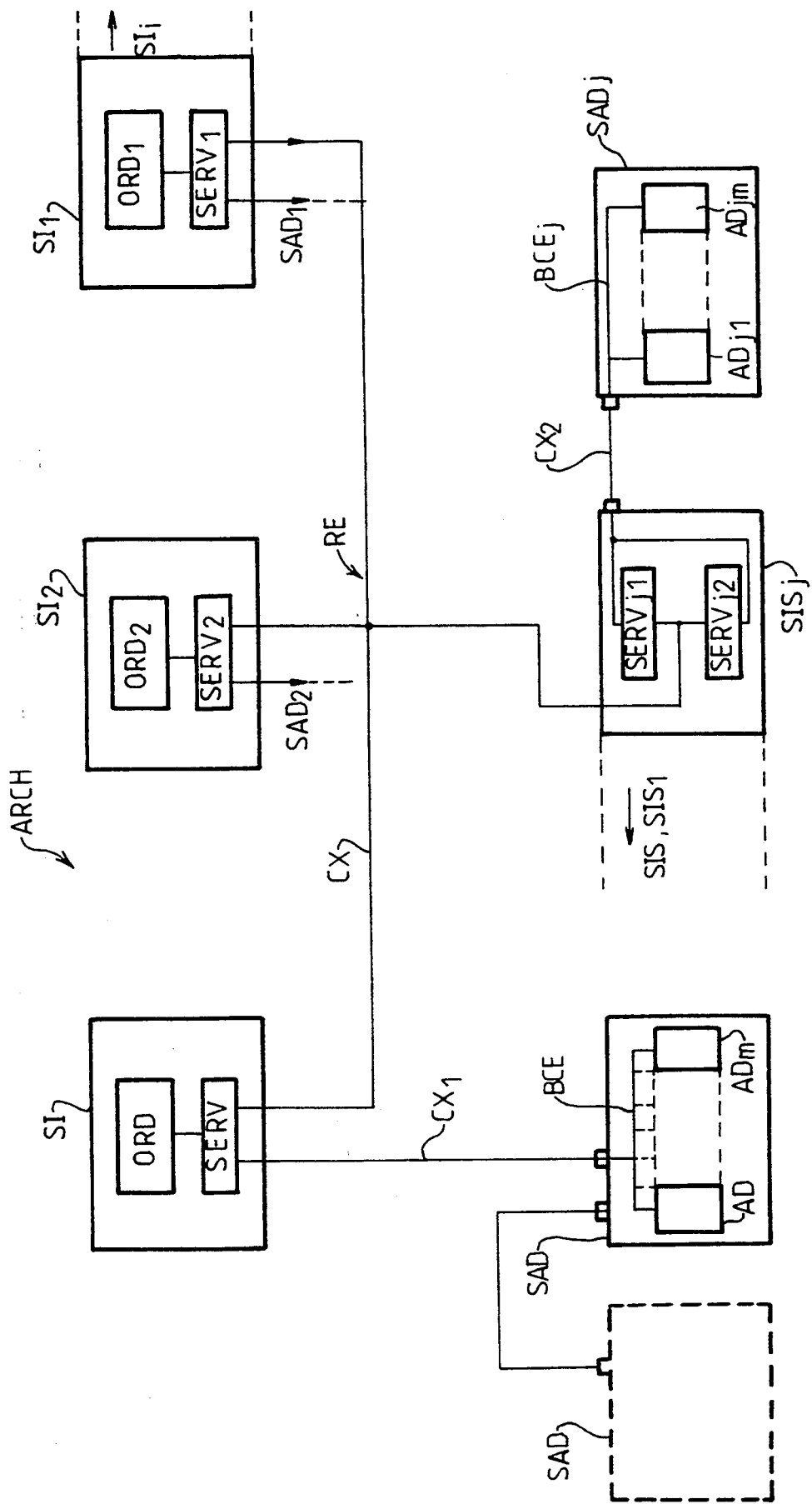
FIG. 1 is a highly simplified diagram of the distributed information processing architecture to which the terminal adaptors, grouped together in the host structure of the invention, belong.

Turning to FIG. 1, a distributed information processing architecture ARCH, into which the host structure of the invention fits, is shown. ARCH includes on the one hand a plurality of information processing systems SI, $SI_1$, $SI_2$, . . . , $SI_i$, a plurality of server information processing systems SIS, $SIS_1$, . . . , $SIS_j$, all of them part of an Ethernet network RE, the transmission medium of which is constituted by a coaxial cable CX.

ARCH also includes a plurality of adaptor systems, such as the system SAD connected via the coaxial cable $CX_1$ to the information processing system SI, or the adaptor system $SAD_j$ connected via the coaxial cable $CX_2$ to the server information processing system $SIS_j$. This adaptor system is contained in the host structure of the invention, which is described in conjunction with FIGS. 4–13.

The information processing systems $SI_1$, $SI_2$ may also be connected to the adaptor systems $SAD_1$, $SAD_2$, respectively, and the system $SI_i$ may be connected to the adaptor system $SAD_i$, etc.

The information processing systems SI, $SI_1$, . . . , $SI_i$ have an analogous structure. Hence the system SI includes a computer ORD and a communications server SERV; and in the same way, the information processing system $SI_i$ includes a computer $ORD_i$ and a communications server $SERV_i$.

The server information processing systems $SIS_j$ all have analogous structures and include, for example:

a first communications server (SERV) and second communications server ($SERV_j$). All the communications servers SERV, . . . , $SERV_i$, . . . , SERV, $SERV_j$, etc., have the same structure.

In the same way, the adaptor systems SAD, . . . , $SAD_j$ all have an analogous structure. For example, the adaptor system SAD includes a plurality of terminal adaptors (AD, $AD_1$, . . . , $AD_m$, . . . ), while the adaptor system $SAD_j$ includes the terminal adaptors (AD, . . . , $AD_{jm}$ . . .).

Each adaptor AD, . . . , $AD_m$, and AD, . . . , $AD_{jm}$ is associated with a plurality of synchronous or asynchronous input/output terminals, which are three in number in the preferred exemplary embodiment of the invention.

The server SERV may be associated as needed, or in other words depending on the number of synchronous or asynchronous terminals that are connected to it, with other adaptor systems besides SAD, such as in particular the adaptor system $SAD_k$ shown in FIG. 1 (details of how SAD, $SAD_k$ and SERV are connected to one another are provided in FIG. 13). It is understood that the same may be true of the server information processing system $SIS_j$, which may be connected to other adaptor systems than the system $SAD_j$, depending on the number of input/output terminals to which this server information processing system is connected.

Figure 2:
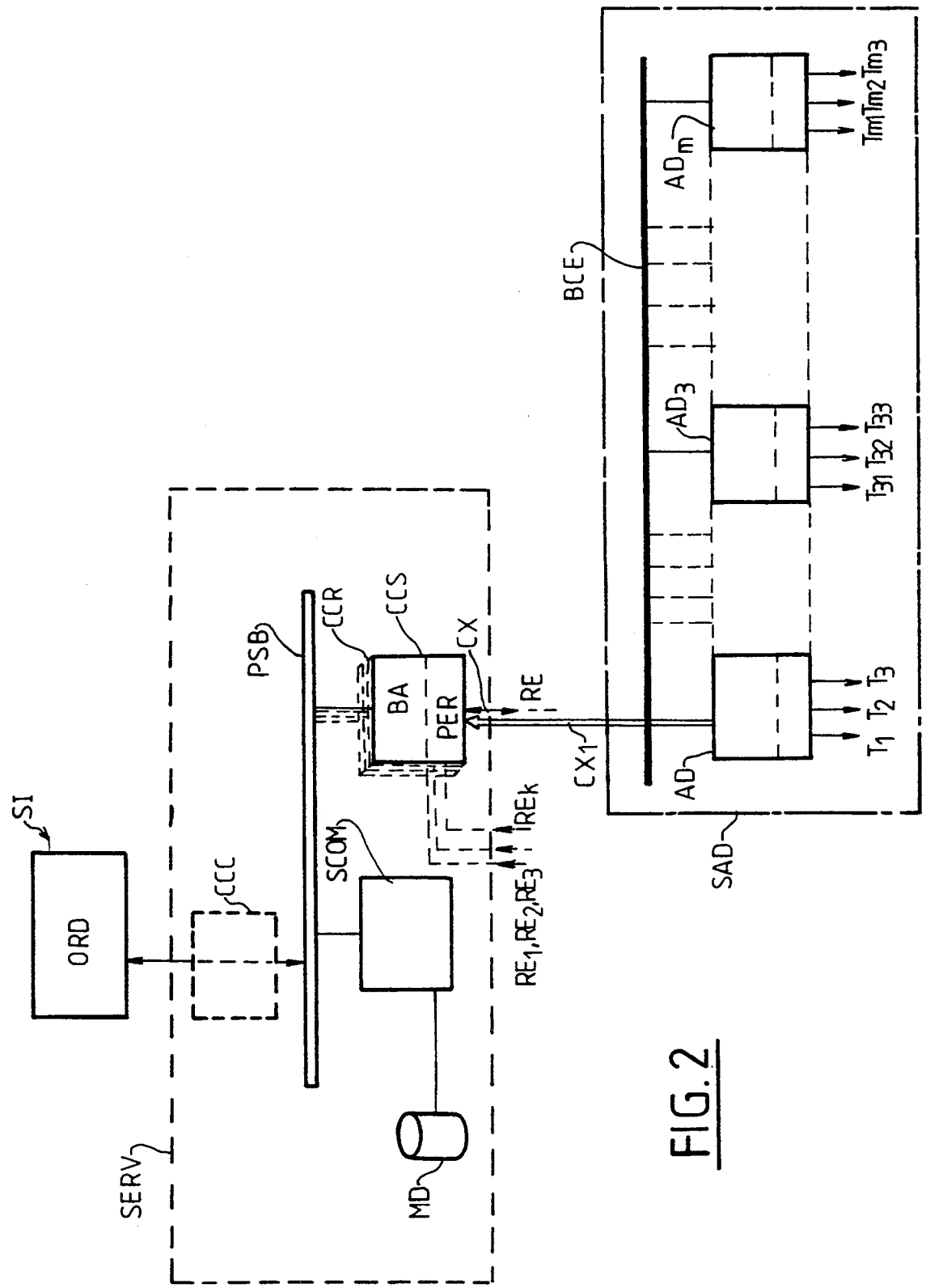
FIG. 2 is a highly simplified diagram of an information processing system including a computer and a communications server and an adaptor system that includes a plurality of adaptors, each connected to a plurality of input/output terminals, these adaptors being grouped together in a host structure according to the invention.

Turning now to FIG. 2:

This figure shows the information processing system SI, which includes at least one computer ORD connected on the one hand, via the server SERV, to the Ethernet network RE and to the adaptor system SAD, and on the other hand to a set of networks of a different type (different from the Ethernet type), that is, $RE_1$, $RE_2$, . . . , $RE_k$, via a plurality of links of a different type.

The server SERV manages and performs the transfer of frames sent by the computer ORD to the networks, and vice versa. (It will be recalled that a message sent by any arbitrary terminal is made up of a set of elementary blocks of digital information, each block being called a frame.)

The server SERV includes the following:

A central processing unit SCOM, which administers and manages the server. In particular, it loads all the software and firmware, associated with each of the boards constituting the server, into these boards at the time of their initialization.

The parallel bus PSB, preferably of the Multibus II type.

A set CCR of communications controllers making it possible to connect the server (and hence ORD) to the various networks RE, $RE_1$, . . . , $RE_k$. More particularly, it includes the communications controller CCS which enables connecting the server to the Ethernet network RE. Such a controller is described in detail in the French Patent Application filed on the same date as the present one, by the present applicant, entitled "Architecture informatique distribuéeutilisant un réseau local de type CSMA/CD" [Distributed Information Processing Architecture using a CSMA/CD-Type Local Area Network].

The server SERV in its entirety is considered here as a terminal of the network RE, communicating with the other terminals $SERV_1$, . . . , $SERV_j$, . . . , $SIS_j$, . . . , SAD.

The computer ORD may be connected either directly to the bus PSB, for example via an Intel MPC 82389 coprocessor, or preferably via a central communications coupler (CCC), above all in the case where a plurality of computers other than ORD (which are not shown in FIG. 2, for simplicity) are connected to the server SERV (CCC is represented by dashed lines in FIG. 2). In that case, the coupler CCC has a structure analogous to CCS.

The adaptor system SAD, as noted above, includes terminal adaptors AD, $AD_1$, $AD_2$, $AD_3$, . . . , $AD_m$. The adaptor AD is associated with the synchronous or asynchronous input/output terminals $T_1$, $T_2$, $T_3$, while the adaptor ADm is associated with the input/output terminals $T_{m1}$, $T_{m2}$, and $T_{m3}$.

Each of the system adaptors SAD is connected to the same copper bus BCE, of the Ethernet type, which is part of the host structure of the invention and will be described in further detail hereinafter. It will be seen that the system SAD can in turn be considered as a particular terminal of the Ethernet network RE.

The frames originating in the computer ORD and intended for the network RE travel by way of PSB to the communications controller CCS. This controller divides each of them into a plurality of data packets or "buffers", forms a plurality of Ethernet-type frames from them, and manages and performs the transfer of these frames either to the adaptor system SAD or to the other terminals of the network RE. In return, it receives the Ethernet frames originating from the system SAD or the other terminals of the network RE, divides them into a plurality of buffers, and from them forms the frames intended for the computer ORD. It manages and performs their transfer from the network RE to the computer ORD.

The role of each adaptor is as follows: It receives the Ethernet frames originating in the server SERV over the cable $CX_1$, stores them, and forms frames whose format is specific to each of the input/output terminals with which it is associated. Next, it performs the transfer of these frames, thus formed, to each of the terminals. Hence it can be said to convert the Ethernet-type frames into frames specific to each of the input/output terminals, by adapting the protocol and transmission rate of the Ethernet network to the protocol and transmission rate of the specific links of these same terminals. The same work is done in the opposite direction, or in other words from the input/output terminals to the Ethernet network.

The detailed structure and function of the communications controller CCS are provided in the aforementioned French Patent Application filed on the same date as the present one.

Figure 3:
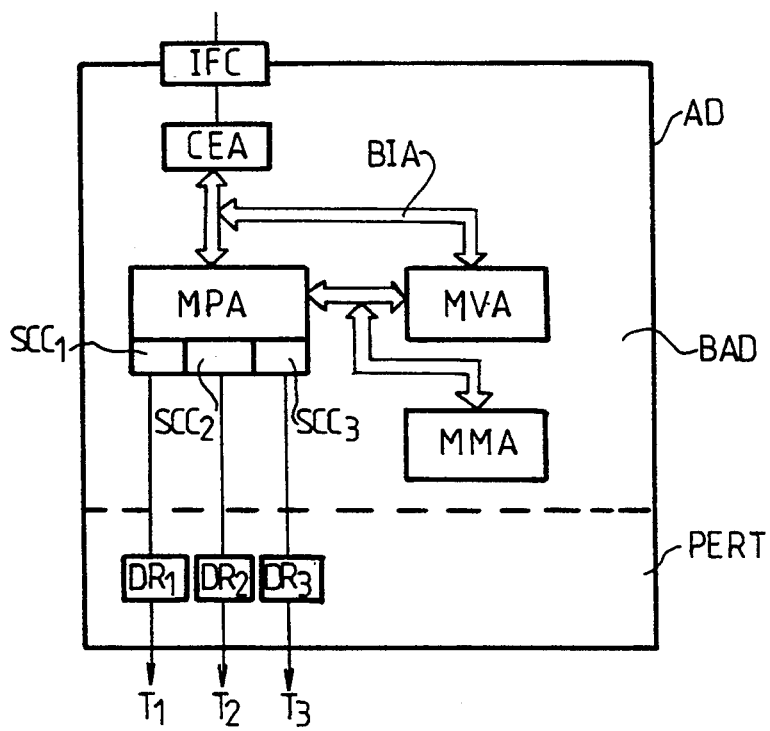
FIG. 3 shows the hardware structure of a terminal adaptor belonging to the adaptor system contained in the host structure of the invention.

The description now turns to FIG. 3, which shows the hardware structure of the adaptor AD:

The adaptor AD includes a base unit BAD and a peripheral part PERT.

The base unit BAD is strictly identical from one adaptor to the other, while the peripheral part PERT differs depending on the type of input/output terminals with which the adaptor is associated.

The base unit BAD includes the following:

An interface IFC constituted in fact by a Cheapernet-type transceiver, connected to the cable $CX_1$ in a way that will be described in detail hereinafter in conjunction with the more detailed description of the host structure.

An Ethernet-type controller CEA, constituted for example by a National Semiconductors Circuit, called SNIC 83901 by the manufacturer. Such a circuit makes it possible to transmit frames that observe the aforementioned standard 8802.3 or to receive frames coming from the network RE in accordance with this same standard. Further details of this controller CEA may be found in the technical files of the manufacturer.

A microprocessor MPA, associated on the one hand with a random access memory MVA with a capacity of 512K, and a programmable read-only memory MMA.

The three identical serial communications controllers $SCC_1$, $SCC_2$, $SCC_3$, each of them associated with a particular terminal; specifically, the controller $SCC_1$ is associated with the terminal $T_1$, the controller $SCC_2$ with the terminal $T_2$, and the controller $SCC_3$ with the terminal $T_3$.

In a preferred exemplary embodiment of the invention, the microprocessor MPA and the three controllers $SCC_1$–$SCC_3$ are constituted by a Motorola microcontroller 68302 (it is known that such a microcontroller is in fact formed by associating a 68000-type microprocessor with a peripheral part embodied by serial communications controllers. The 68000 microprocessor accordingly constitutes the microprocessor MPA, while the three controllers $SCC_1$–$SCC_3$ constitute the peripheral part of the 68302 microcontroller).

The peripheral part PERT is constituted by three line adaptors $DR_1$, $DR_2$, $DR_3$, each corresponding respectively to the terminals $T_1$, $T_2$, $T_3$ and to the serial communications controllers $SCC_1$–$SCC_3$.

As can be seen from FIG. 3, the elements CEA, MPA are connected to the internal bus BIA of the microprocessor MPA, the latter being also connected to the memories MVA and MMA by a bus of the same type as BIA.

The line adaptors $DR_1$, $DR_2$ and $DR_3$ are constituted by National Semiconductors elements 3487-3486, for example. It will be recalled that line adaptors (also known as "line drivers") assure the electrical adaptation of the voltage levels used in CTL-type integrated circuits (0 and 5 V), such as those constituting the adaptor AD, to the level used in the links that enable connecting the adaptors to the terminals $T_1$, $T_2$, $T_3$.

It is appropriate to specify that each adaptor, such as AD, is assigned an Ethernet address over 48 bits by its manufacturer. This address is written into the memory MMA and hence is accessible to the microprocessor MPA.

Similarly, as soon as it is inserted into its host structure, each adaptor knows, by way of the microprocessor MPA, its geographical location inside the structure and its number that has been assigned arbitrarily by the manufacturer. This constitutes its geographic address, which is written into the structure by a suitable encoding device (described hereinafter), which the microprocessor MPA reads upon the insertion of the adaptor into its backpanel.

Further details on the function of the adaptor AD, as well as on setting up the dialog and on the dialog itself between this adaptor and a communications server, such as the server SERV, are provided in the aforementioned French patent application filed on the same date as the present one by the present applicant.

Figure 4:
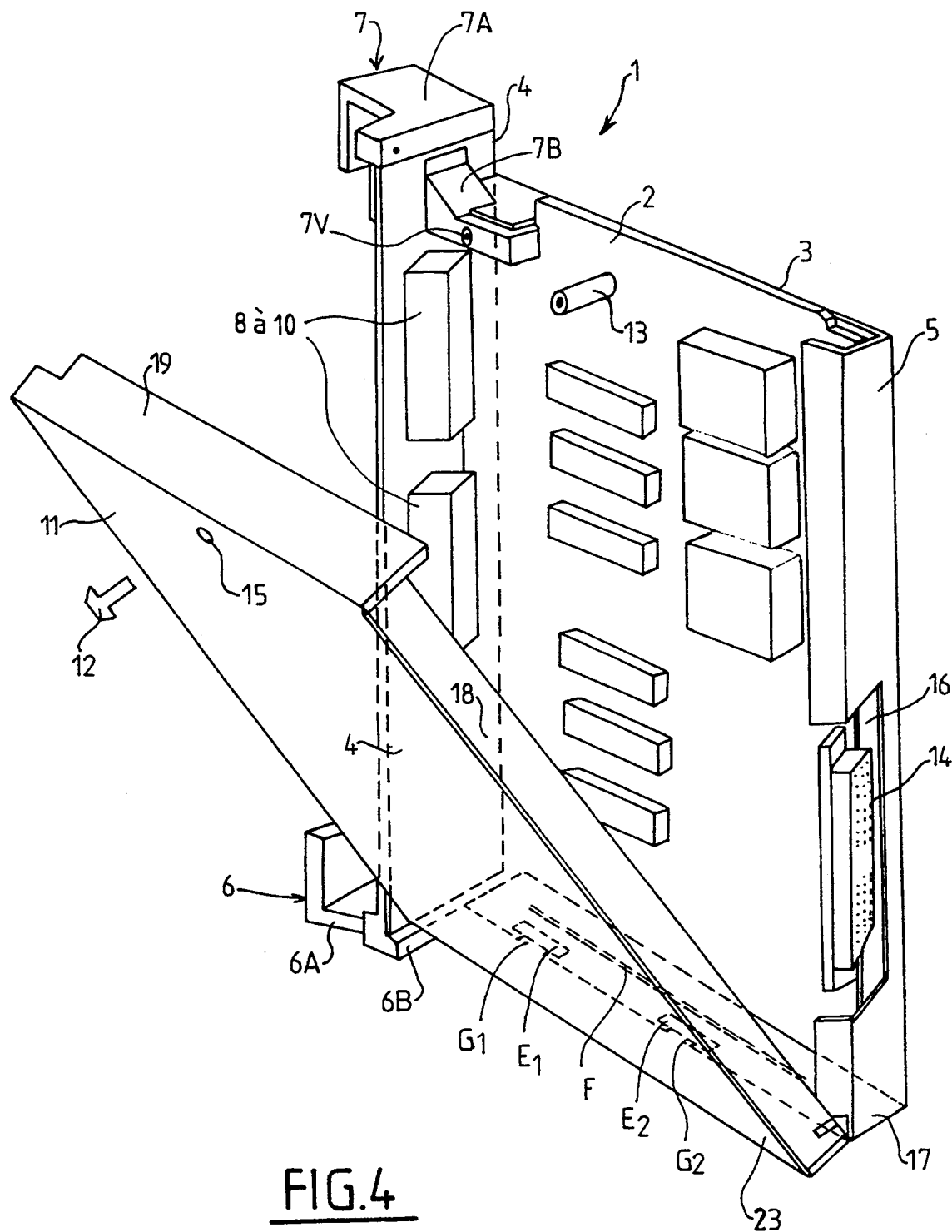
FIGS. 4 and 5 are ¾ perspective views, seen from the back and front, respectively, of a cartridge containing the electronic circuit of an adaptor, this cartridge being intended for insertion into the first (front) compartment of the host structure of the invention.
Figure 5:
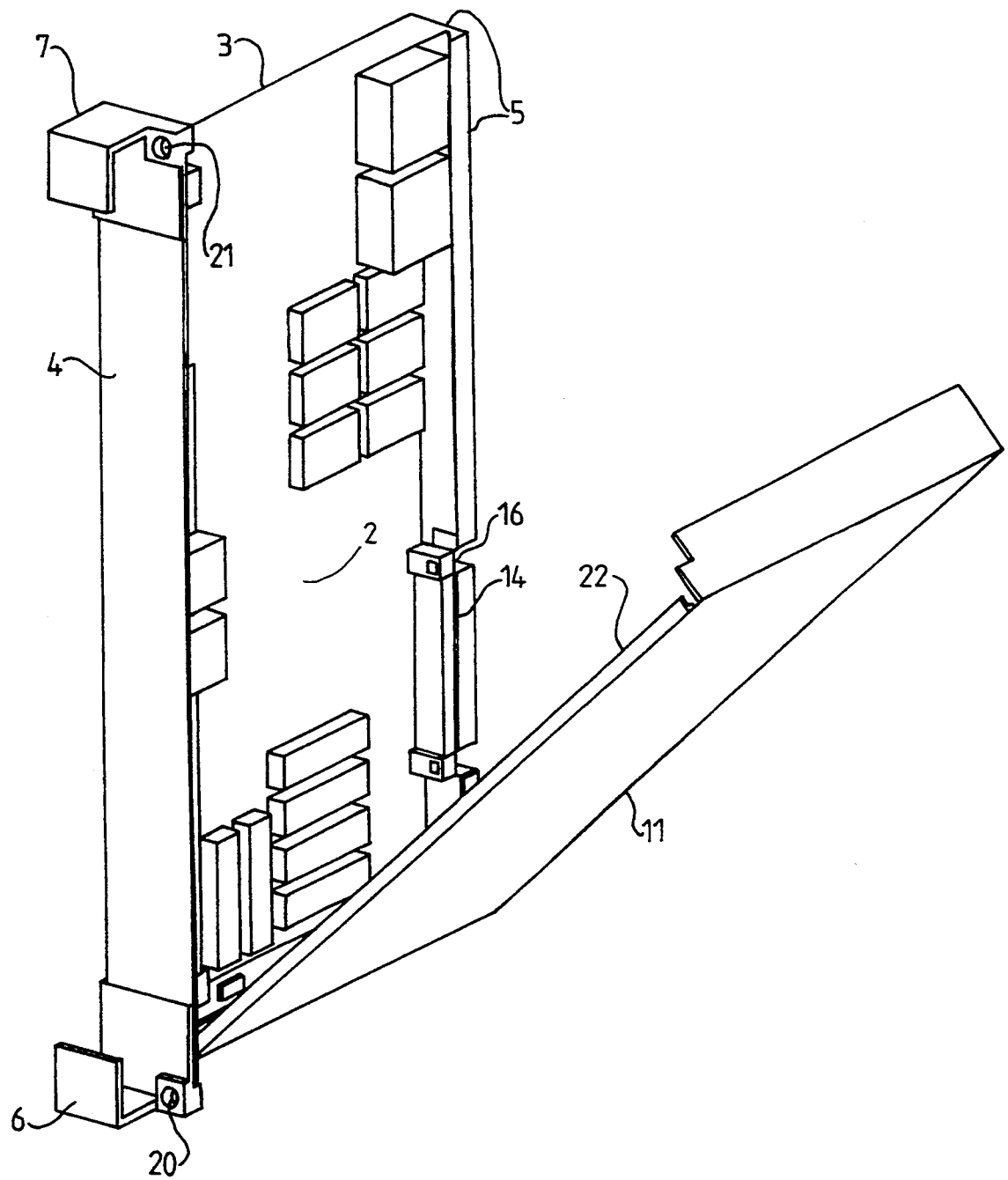

The set of elements comprising the hardware structure of the adaptor AD shown in FIG. 3 is disposed on a board, such as the board 2 shown in FIGS. 4 and 5. In the present specification, the term "adaptor" will be used for the board, the hardware structure formed of the elements described in conjunction with FIG. 3, and the set of functional means carried by this hardware structure.

The description now turns to FIGS. 4, 5, 6, 7a and 7b.

Taken together, these figures show a cartridge 1 containing a board 2. This board 2 may be either an adaptor, such as that described in conjunction with FIGS. 1-3, or a special board carrying an interface adaptor, whose role will be described hereinafter. Since the cartridges such as 1 all have the same structure, regardless of the type of adaptor or in other words regardless of the type of input/output terminals with which the corresponding adaptor is associated, the description in conjunction with FIGS. 4-7 is applicable to all types of adaptors. For the same reason, the analogous elements of different cartridges will be identified by the same reference numerals, regardless of the type of adaptor that they contain.

The cartridge 1 includes a mechanical envelope surrounding the board 2. This mechanical envelope is formed by a base support 3, a lid 11, and an L-shaped back face 5 made by bending the same piece of metal that forms the base 3, the long dimension of the L being perpendicular to the base and parallel to the front face 4. The base 3 also includes a rectangular bottom plate 17, which is accordingly perpendicular both to the base 3 and to the front and back faces 4 and 5. This bottom plate 17 includes a longitudinal slit F and two slots $E_1$ and $E_2$ that are parallel to F.

The base substrate 3 is a rectangular plate having substantially the same dimensions as the board 2, which in its rear portion includes a connector 14 enabling its connection to the Ethernet bus BCE (or $BCE_j$), which is located on the backpanel FP described hereinafter in conjunction with FIGS. 11a, 11b and 11c. The connector 14 is a standard elbowed female DIN conductor of the Reverse 41612 type. The back face 5 includes a cutout 16 of rectangular shape that enables the passage of the conductor 14.

In FIGS. 4 and 5, the board 2 has been shown provided with a certain number of its components, which are symbolically represented by right parallelepipeds.

The front face 4 is perpendicular to the base substrate 3 (for the sake of clarity in the description and for better comprehension of the drawings, the front face 4 does not give the impression of being perpendicular to the substrate 3 in FIG. 4).

This front face has two locking handles 6 and 7, located on each of its ends, respectively; the locking handle 6 is located in its lower portion in FIGS. 4-7, while the locking handle 7 is located in its upper portion. The two locking handles 6 and 7 allow grasping the cartridge 1 manually, in order to insert it into the host structure P shown in FIGS. 8-10. It also allows locking the cartridge inside the host structure P.

The front face 4 also has three connectors 8-10, which are specific to each transmission link for each of the input/output terminals associated with the adaptor that the board 2 carries. These connectors are disposed one on top of the other and are aligned vertically. They are screwed onto the board 2 (by means of screw/nut systems that are perpendicular to the board but are not shown in FIG. 4, for simplicity.

It will also be noted that the connectors 8-10 are shown removed from the front face 4 in FIG. 4, to make the drawing easier to understand.

The three connectors 8-10 are standard Sub D-type connectors. FIG. 7a, in a front view, makes it possible to better understand the location of these connectors 8-10, with their substantially trapezoidal shape. It also makes it possible to see that the handles 6 and 7 include knurled screws 20 and 21, which are perpendicular to 5 and enable locking the cartridge inside the host structure, as will be better understood in the ensuing description.

The handles 6 and 7 are in fact each composed of a front part 6A, 7A disposed on the opposite side of the board 2 with respect to the front face 4, and a rear protuberance 6B, 7B. The protuberances 6B and 7B each include a screw/nut system 6V, 7V, perpendicular to the board 2, and thus enabling the fixation of the handles 6 and 7 (and hence 4) to the board.

It can thus be seen that the board 2 is made solid to the front face 4 via the two screw/nut systems 6V-7V and by the screw/nut systems of the connectors 8-10.

Preferably, the handles 6 and 7 are made of a single piece of rigid plastic material. In that case, it is clear that the protuberance 6B, 7B is introduced into a hole made for that purpose in the front face 4 (not shown in FIGS. 4 and 5, for the sake of simplicity).

The assembly formed by the board 2 and the front face 4 is inserted into the slit F of the bottom plate 17 of the base 3.

The front face is a piece specific to each type of adaptor (including the interface adaptor), since the connectors (8-10) are specific to each transmission link (V-11, V-24, V-28, V-35, etc.).

The lid 11 is provided with lateral parts 18, 19, 22 and 23 that are perpendicular to it. The part 18 enters into contact with the back face 5 without covering the recess 16, thus enabling the passage of the connector 14 when the cartridge is installed. The lateral part 22 of the lid 11 is parallel to the front face 4 and comes to be seated against it, inside the cartridge. The lower lateral part 23 is provided with two lugs G1 and G2 that fit into the recesses E1 and E2 when the cartridge is installed. After this insertion, the lid 11 is locked by a screw 12 that passes through a hole 15, made in the upper portion of 11, into a collar 13 that is part of the board 2.

The lateral part 19, or upper lateral part, of the lid 11 is perpendicular both to the base support 3 and to the front and back faces 4 and 5, respectively.

Figure 6:
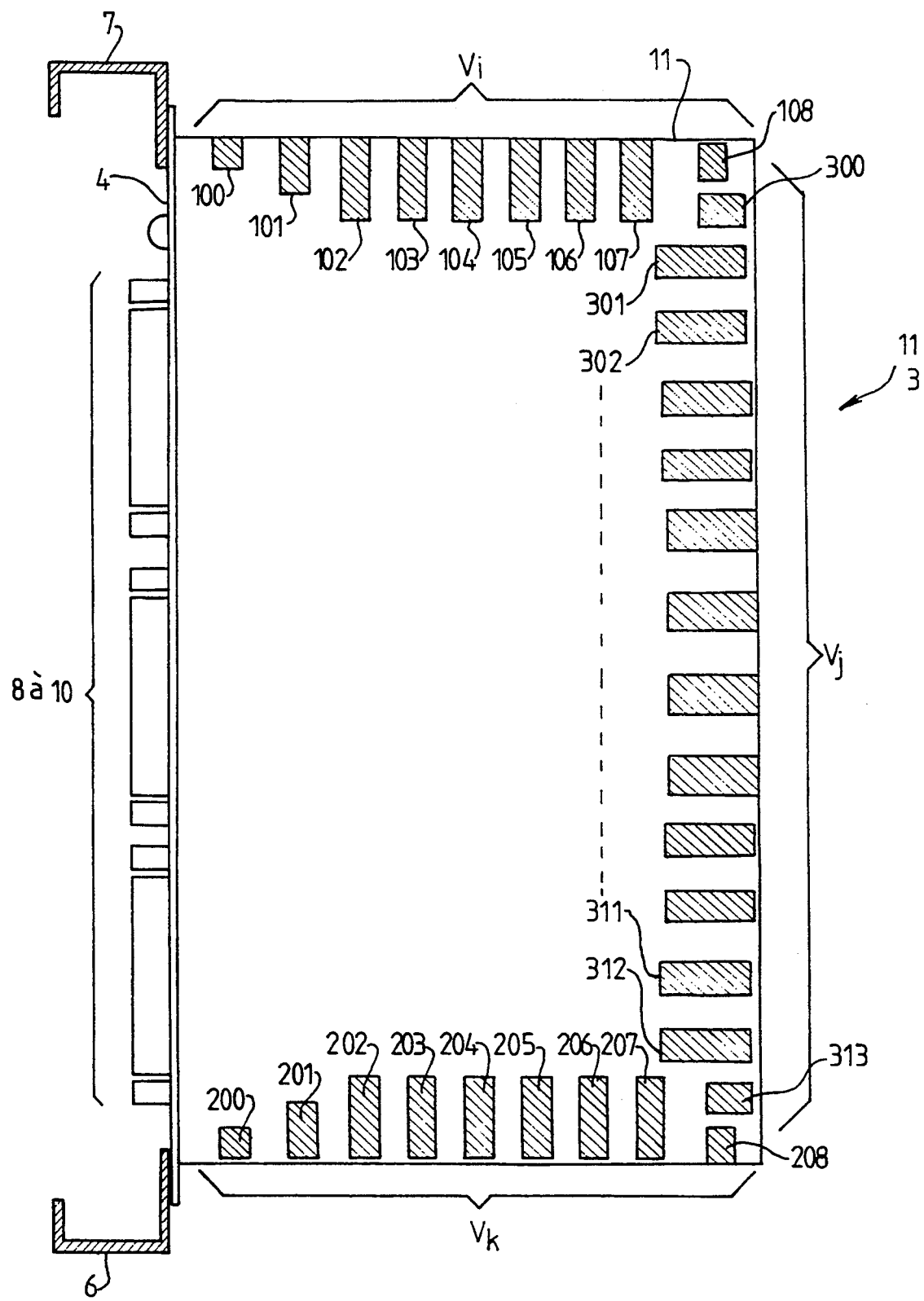
FIG. 6 is a view from above of this cartridge, showing its lid with its various openings making it possible to assure ventilation of the board carrying the electronic circuit forming the adaptor.

As can be seen from FIG. 6, the lid 11 (and identically the base 3) has a plurality of rectangular ventilation holes distributed over its periphery, on its sides other than the side in contact with the front face 4. Hence the two sides of the lid 11 that are perpendicular to the front face 4 (the short dimensions of the rectangle forming the lid 11) are each provided with a respective set of ventilation holes $V_i$ and $V_k$, while the long side of the rectangle that forms the lid 11, parallel to the front face 4 in FIG. 6, is provided with a set of ventilation holes $V_j$.

The set of ventilation holes $V_i$ includes the ventilation holes 100 through 108, which are numbered in increasing order, with the increase in their distance from the front face 4. Hence the ventilation hole 100 is closest to the front face 4, while the hole 108 is farthest away. The hole 100 is the one of the ventilation holes that has the smallest surface area, and the holes 102-107 have the largest surface area (the surface area is the same for each of them), and the holes 101 and 108 have an intermediate surface area. The same is true for the set of ventilation holes Vk, which includes the ventilation holes 200-208, where the hole 200 is the closest to the front face 4 and the hole 208 is the farthest, the holes 202-207 have the largest surface area (each of them having the same surface area, identical to that of the holes 102-107), and the holes 201 and 208 have an intermediate surface area. Thus as can be seen from FIG. 6, all the ventilation holes 100-108, 200-208 have a rectangular shape, and their long dimension is parallel to the front face 4 and to the long dimension that forms the lid 11.

The set of ventilation holes $V_j$ includes the ventilation holes 300-313, where the ventilation hole 300 is located in the upper portion of FIG. 6 and the ventilation hole 313 in the lower portion. The two ventilation holes 300 and 313 have the same surface area, which is smaller than that of the ventilation holes 301 to 312, which all have the same surface area. The ventilation holes 300-313 have a rectangular shape, and their long dimension is parallel to that of the short sides of the lid 11, or in other words perpendicular to the front face 4.

The presence of a large number of ventilation holes made in the lid 11 of the cartridge 1 is necessary because the thermal power dissipated by the set of components forming the adaptor carried by the board 2 is on the order of 12 W. It is accordingly necessary to evacuate the heat dissipated by these components, and it is accordingly $V_i$, $V_j$, and $V_k$ that play this role.

The mechanical envelope of the board 2 of the cartridge 1 has the following function:
  mechanical protection of the board 2,
  protection of the immediate geographic vicinity of the host structure including the cartridge 1 against the various kinds of Hertzian radiation output by the components of the board 2,
  protection of the board 2 from electromagnetic vulnerability (protection against all the magnetic fields of any kinds output by the electrical apparatus located in the immediate geographic vicinity of the host structure that includes the cartridge 1).

The description now turns to FIGS. 8-10, which show a host structure P for a plurality of cartridges such as 1.

In the preferred exemplary embodiment of the invention described here, the host structure P may contain 16 cartridges, that is, 15 cartridges $AD-AD_14$ containing terminal adaptors, and one cartridge ADI containing an interface adaptor (described hereinafter). The same reference numeral will accordingly be used henceforth for the adaptor itself and the cartridge containing it. The cartridge AD occupies the portion farthest to the right in FIG. 8, while the cartridge ADI occupies the portion farthest to the left in FIG. 8.

The structure P essentially includes three major portions, specifically:
  a first, front compartment CAV which allows accommodating the 16 cartridges $AD-AD_14$ and ADI, forming a chassis for guiding the cartridges and fixing the backpanels FP;
  a second, back compartment CAR which includes the power supply device ALIM enabling the supply of electrical power to the set of aforementioned cartridges, along with a forced ventilation device for the structure P, that is, VNT;
  a backpanel FP carrying the copper Ethernet bus BCE, this backpanel being provided with connectors that enable the connection of each of the cartridges, $AD-AD_14$ and ADI, to the bus BCE.

The backpanel FP separates the first compartment CAV from the second compartment CAR, these compartments being considered to be adjacent to one another. It is perpendicular to each of the boards 2 that the 15 cartridges $AD-AD_14$ include.

The host structure P has the form of a right parallelepiped, and each of the first and second compartments also has the form of a right parallelepiped.

The cartridges, $AD-AD_14$ and ADI, are introduced from the front 30 of the host structure P. The cartridges are introduced in such a manner that they are perpendicular to this front 30 and parallel to one another (the cartridges can be likened to rectangular surfaces, so that it can be said that they are parallel to one another; this likewise means that the boards 2 carrying the corresponding adaptors are parallel to one another). Once inserted into the compartment CAV, each of the cartridges is locked there by way of its knurled fixation screws 20 and 21. These screwed are screwed to the inside of threaded holes made in two lower and upper bars $BA_1$, $BA_2$ which are parallel to one another, disposed on the front 30 of the compartment CAV and parallel to its long dimension. These holes are symbolically represented by aligned dots at $BA_1$ and $BA_2$ in FIG. 9. If one wishes to change one of the cartridges, for example if the corresponding adaptor is defective, or for some maintenance operation, this cartridge can be withdrawn, without interrupting the function of the others, and replaced by a similar cartridge.

FIGS. 9 and 10 show in further detail how the rear compartment CAR of the host structure P is constituted.

This rear compartment includes a ventilation and power supply block BVA, which is introduced, at the time the host structure P is installed, into the back compartment via the front face 31 thereof, at the moment of its connection with the backpanel.

The block BVA includes a power supply ALIM and a ventilation block VNT: Once BVA has been introduced all the way into the compartment CAR, ALIM connects itself directly to the backpanel FP, in a manner known per se, by way of a pair of standard 96-pin DIN connectors and a flexible circuit internal to ALIM.

The rear face of the block BVA, that is, 37, includes two circular openings 35 and 36, inside which fans $VN_1$ and $VN_2$ that constitute the ventilation block VNT. The fans $VN_1$ and $VN_2$ are identical. It is clear that when the block BVA is installed inside the rear compartment CAR, its rear face 37 is congruent with the rear face 31.

The back face 31 includes an edge 40 of very slight height, much less than the total height of the structure P, which is parallel to the front face 30 of P. This edge contributes to keeping the block BVA in place when the block is inserted into the second, rear compartment CAR. Once the block BVA has been introduced into this compartment, it is held in place by the edge 40, on the one hand, and by means of two screws $VI_1$ and $VI_2$, on the other, which are disposed on the edges of 37 on either side of 35 and 36, respectively, and are fixed on the edges $R_1$ and $R_2$ disposed on 31 and solidly joined to the sides 32 and 33 of the structure P. The latter includes a lid 34 that is perpendicular to the faces 30 and 31 of the host structure P.

The lid 34 is inserted by being slid, by its front and rear edges 42 and 41, respectively, on the upper portion of the structure P (for example, by means of rails, disposed in its upper portion, on the front and rear faces 30 and 31, which are not shown in FIGS. 8-10 for the sake of simplicity but can easily be supplied by one skilled in the art). This lid is locked by the definitive placement of BVA when $VI_1$ and $VI_2$ are fixed on $R_1$ and $R_2$; its back edge 41 is held solidly in place by 37.

Turning to FIGS. 11a, 11band 11c, the backpanel FP is shown, which carries the copper Ethernet bus BCE. This backpanel FP includes a printed circuit board CI on which the copper bus is engraved. This bus includes two branches $B_3$ and $B_5$ that are parallel to one another and to the length of the rectangular backpanel FP, two branches $B_2$ and $B_4$ that are parallel to one another and parallel to its width, and a connecting branch $B_1$ of slight length parallel to the two main branches $B_3$ and $B_5$. As can be seen in FIG. 11, the three branches $B_3$, $B_2$ and $B_5$ form a U to which the branch $B_4$ is connected, this last branch in turn being connected to the branch $B_1$. In this way, the five branches $B_1$-$B_5$, which have no electrical discontinuity, form the bus BCE. This copper bus BCE includes three parallel copper tracks, that is, the central track PC and the two lateral tracks $PL_1$ and $PL_2$. They play the same role as the sheathing layer of a coaxial 50 Ω cable. They are connected to neither ground, nor the structure P, nor the logical 0 V of ALIM. They are in electrical contact with the sheathing layer of the coaxial cables of the network RE that are external to P, by way of ADI.

The disposition of the tracks, their dimensions, and their respective positions all have the objective of adhering to the characteristic nominal impedance of 50 Ω that is specific to a coaxial Ethernet cable. A coaxial-type link is thus made at the backpanel FP, while the tracks are in fact engraved on the copper. The central track enables transporting information from the network RE to each of the adaptors AD-$AD_1$4.

The backpanel FP includes a plurality of female connectors CF, $CF_1$ through $CF_1$4 enabling the connection of the adaptors AD-$AD_1$4 to the network RE, by way of male connectors 14 (see FIGS. 4 and 5). The connectors are connectors of the DIN Reverse 41.612 type with 48 pins, of which 6 pins are not used, as FIG. 11b shows, which is a more detailed view of FIG. 11a particularly showing the connectors CF, $CF_7$, and $CF_1$4. For each of the connectors CF-$CF_1$4, six connection pins have been taken out, that is, the pins 7b, 7b, 9b, 7c, 8b and 9c. On the other hand, the pins 7a, 8a, 9a have been preserved, enabling connection of each of the connectors in question to $PL_2$, PC and $PL_1$, respectively, at the level of the main central branch $B_3$ of BCE.

The backpanel FP additionally includes a connector CORE enabling its connection to the external coaxial cables by way of ADI ($BNC_1$, $BNC_2$). This connector CORE is a female connector of the DIN 41612 type, with 78 points in the shape of an M.

As can be seen in FIG. 11b, CORE is connected to the branch $B_1$, via two connection pins to $PL_1$, two connection pins to $PL_2$, and one connection pin to PC. CORE is connected to the upper portion of $B_5$ in the same way. It can be seen that CORE is not connected to the branch $B_3$. It can also be seen that $PL_1$ and $PL_2$ are connected to one another at the ends of $B_1$ and $B_5$. Electrically, $PL_1$ and $PL_2$ have a negative sign and PC has a positive sign, in accordance with the Ethernet standard.

FIG. 11c, in perpendicular section along the line AB, shows the shape of the tracks $PL_1$, PC and $Pl_2$.

The track PC is rectangular in shape, connected to a wire $F_1$ which is perpendicular to it. The tracks $PL_1$ and $PL_2$ are symmetrical with respect to $F_1$. $PL_1$ includes two lateral rectangular conductors 51 and 52 surrounding a central conductor 50 which is also rectangular in shape but has a surface area less than 51 and 52. 50, 51 and 52 are connected to the same wire $F_2$, which is perpendicular to them.

$PL_2$ has the same structure as $PL_1$ and includes two lateral conductors 61, 62 surrounding a central conductor 60; these three conductors are connected to the same wire $F_3$, which is perpendicular to them.

The female connector CORE enables connecting the backpanel to the interface adaptor ADI by way of the corresponding male connector disposed on the back face of this interface adaptor. This male connector is disposed in the same manner as the connector 14 of FIGS. 4 and 5. The interface adaptor ADI is included in a cartridge whose constitution is analogous to that of the cartridge 1 shown in FIGS. 4-7. In that case, the connector 14 is an elbowed male DIN 41612 connector with 78+2 pins forming an M. The interface cartridge ADI has a front face that is slightly modified compared with the front face 4 of FIGS. 4, 5, 6 and 7a. This same front face 4 of the cartridge ADI is shown in FIG. 7b. It includes the same fixation handles 6 and 7 as the cartridge 1. It includes two encoder wheels $RC_1$, $RC_2$. Each of these two encoder wheels enables encoding over 8 bits, such that the set of two encoder wheels enables hexadecimal encoding (OO-FF), giving the code of the geographical address of the host structure P of the adaptors AD-$AD_1$4 (the adaptors AD-$AD_1$4 correspond, for example, to the adaptors AD-$AD_m$ shown in FIGS. 1 and 2 constituting the adaptor system SAD, where m=14, and P constitutes the host structure of SAD).

The front face 4 of ADI further includes two standardized connectors $BNC_1$, $BNC_2$ enabling connecting this adaptor to the network RE on the one hand (for example via $BNC_1$) and to another host structure containing a different adaptor system from SAD, on the other, by way of $BNC_2$.

The board 2 of ADI includes only conductors for linkage between $BNC_1$, $BNC_2$ and 14.

The above description accordingly makes it possible to better understand how the adaptors $AD-AD_{14}$ are connected to the network RE by way of the interface adaptor ADI. (In fact, each interface IFC is thus connected to RE by way of 14, of one of the connectors $CF-CF_{14}$, of BCE and ADI).

Turning now to FIGS. 12 and 13:

FIG. 12 shows how 45 adaptors $AD-AD_{44}$ are connected to one another by a standard Ethernet link. Each of the adaptors in this case is connected to its neighbor by way of a coaxial cable having a minimum length of 0.50 m. The adaptor AD is hence connected to the adaptor $AD_1$ by way of a coaxial link $LC_1$ having a minimum length of 0.50 m. The adaptor is in turn connected by way of a coaxial cable CX to the server SERV, and terminators having an impedance of 50 Ω are located at the two ends of the link, one at the server SERV and the other at the last adaptor $AD_44$, these two terminators being represented by the symbols $T_1$ and $T_2$. In this way, the maximum distance between the server and the adaptor $AD_44$ is 280 m at maximum (maximum length of an Ethernet 50 Ω coaxial cable length, in accordance with the standard).

FIG. 13 shows the situation with a link using host structures P, $P_1$, $P_2$ that each include 15 adaptors, that is, the adaptors $AD-AD_{14}$ for the host structure P, the adaptors $AD_{15}-AD_{29}$ for the host structure $P_1$, and the adaptors $AD_{30}-AD_{44}$ for the host structure $P_2$. The host structure P contains the adaptor system SAD, while the host structures $P_1$ and $P_2$ contain the adaptor systems $SAD_1$ and $SAD_2$.

The server SERV, or a server information processing system $SIS_j$, is connected to the first adaptor system SAD by way of a coaxial cable CX or $CX_2$. The system SAD (the host structure P) is connected by way of $BNC_2$ and the coaxial link $LC_1$, having a minimum length of 0.50 m, to the adaptor system $SAD_1$ (at $BNC_1$), which in turn is connected via $BNC_2$ and a coaxial link having a minimum length of 0.50 m, that is, $LC_2$, to the adaptor system, $SAD_2$ at $BNC_1$.

Hence it can be seen that the set formed by the three adaptor systems SAD, $SAD_1$, $SAD_2$ (or the three host structures P, $P_1$, $P_2$) is much more compact, less bulky, and much more practical than that of FIG. 12 whose minimum length is 220 m. The set formed by $SAD-SAD_2$ thus has a minimum length of 1 m. However, the maximum length of the network constituted by the server SERV and the 45 adaptors $AD-AD_{44}$ of FIG. 12 has a maximum length of 280 m. The set formed by the server SERV and the three adaptor systems $SAD-SAD_2$ has a maximum length of 100 m, in order to include any possible mismatches in impedance due to the different backpanels FP of SAD, $SAD_1$, and $SAD_2$. Nevertheless, this slight disadvantage is more than greatly compensated for by the advantages that have been described above.

We claim:

1. A host structure (P) for terminal adaptors ($AD-AD_{14}$, ADI) belonging to a distributed information processing architecture (ARCH), formed of a plurality of information processing systems (SI, $SI_1$, $SIS_j$, SAD, ..., $SAD_j$), each connected by way of communication servers (SERV, $SERV_1$, SERV, $SERV_j$) to a plurality of networks (RE, $RE_1$, ..., $RE_k$) each system being connected to a plurality of synchronous or asynchronous terminals ($T_1$, $T_2$, $T_3$, $T_{m1}$, $T_{m2}$, $T_{m3}$) by way of at least one of the networks (RE) and terminal adaptors (AD, ..., $AD_m$ ..., $AD_j$), each of which is connected on the one hand to said network and on the other to at least one terminal ($T_1$-$T_3$, $T_{m1}$-$T_{m3}$, $T$-$T_{j3}$) by way of a synchronous or asynchronous transmission link, characterized in that said host structure includes:

a first compartment (CAV) containing a plurality of cartridges (1, $AD-AD_{14}$, ADI) being parallel to one another, and each containing a board carrying a terminal adaptor having an electronic circuit, a base substrate (3) to which the board is fixed, a front face (4) and a back face (5) perpendicular to the board and to the substrate (3), respectively, and including first connection means (8–10) for connection to transmission medium links among input-/output terminals associated with an adaptor carried by the board, and second connection means (14) for Connection with a specific bus (BCE, $BCE_j$), and a lid (11) parallel to the board and to the base substrate (3) for closing the cartridge and enclosing the board, a second compartment (CAR) containing an electrical supply to the boards contained in the first compartment and a ventilation device (VNT) of the structure, the first and second compartments being separated by a backpanel (FP) carrying a copper bus (BCE, $BCE_j$) specific to a network (RE) to which the boards carrying the terminal adaptors are connected, wherein the specific bus (BCE, $BCE_j$) and the network (RE) are of the Ethernet type, the specific bus including three separate tracks (PC, $PL_1$, $PL_2$), a central track (PC) for transporting information and being equidistant from two lateral tracks ($PL_1$, $P_2$), said lateral tracks serving to provide a sheathing layer for the central track, each of the tracks being formed by a conductor engraved into the copper, the backpanel (FP) including means ($CF-CF_{14}$, CORE) for connecting the boards to the network (RE) and to the bus (BCE), on the one hand, and to the power supply (ALIM), on the other.

2. The host structure (P) of claim 1, characterized in that the front face (4) includes upper and lower portions having means (7, 6) for grasping and locking the corresponding cartridge inside the first compartment (CAV).

3. The host structure (P) of claim 1 characterized in that the lid (11) is of rectangular shape and the base substrate (3), includes on three sides of its periphery other than a side in contact with the front face (4), a plurality of sets ($V_i$, $V_j$, $V_k$) of ventilation holes each associated with one of said sides for enabling the evacuation of the thermal energy given off by components of the board carrying the adaptor.

4. The host structure (P) of claim 3, characterized in that the ventilation holes are rectangular in shape, their length being perpendicular to the associated sides, two of the sides being shorter than the other, and the ventilation holes located on the short sides being identical to one another.

5. The host structure (P) of claim 1, characterized in that the backpanel (FP) includes third connection means ($CF-CF_{14}$) connected to the bus (BCE) and adapted to be connected to the corresponding second connection means (14) of the back of the adaptors, and fourth connection means (CORE) adapted to be connected to the second connection means (14) of the back face of an interface cartridge (ADI).

6. A host structure (P) for terminal adaptors (AD-AD$_{14}$, ADI) belonging to a distributed information processing architecture (ARCH), formed of a plurality of information processing systems (SI, SI$_1$, SIS$_j$, SAD, ..., SAD$_j$), each connected by way of communication servers (SERV, SERV$_1$, SERV, SERV$_j$) to a plurality of networks (RE, RE$_1$, ..., RE$_k$) each system being connected to a plurality of synchronous or asynchronous terminals (T$_1$, T$_2$, T$_3$, T$_{m1}$, T$_{m2}$, T$_{m3}$) by way of at least one of the networks (RE) and terminal adaptors (AD, ..., AD$_m$, ..., AD$_j$), each of which is connected on the one hand to said network and on the other to at least one terminal (T$_1$-T$_3$, T$_{m1}$-T$_{m3}$, T-T$_{j3}$) by way of a synchronous or asynchronous transmission link, characterized in that said host structure includes:

a first compartment (CAV) containing a plurality of cartridges (1, AD-AD$_{14}$, ADI) being positioned parallel to one another, and each containing a board carrying a terminal adaptor having an electronic circuit, said cartridges being within a housing comprising a base (3) to which the board is fixed, a front face (4) and a back face (5) perpendicular to the board and to the base (3), said front and back faces including first connection means (8-10) for connection to transmission media links among input/output terminals associated with an adaptor carried by the board, and second connection means (14) for connection with a specific bus (BCE, BCE$_j$), and a lid (11) for closing the housing, a second compartment (CAR) containing an electrical supply to the boards contained in the first compartment and a ventilation device (VNT) of the structure, the first and second compartments being separated by a backpanel (FP) carrying a copper bus (BCE, BCE$_j$) specific to a network (RE) to which the boards carrying the terminal adaptors are connected, wherein the specific bus (BCE, BCE$_j$) and the network (RE) are of the Ethernet type, the specific bus including three separate tracks (PC, PL$_1$, PL$_2$), a central track (PC) for transporting information and being equidistant from two lateral tracks (PL$_1$, PL$_2$), said lateral tracks serving to provide a sheathing layer for the central track, each of the tracks being formed by a conductor engraved into the copper, the backpanel (FP) including means (CF-CF$_{14}$, CORE) for connecting the boards to the network (RE) and to the bus (BCE), on the one hand, and to the power supply (ALIM), on the other.

7. The host structure (P) of claim 6, characterized in that the backpanel (FP) includes third connection means (CF-CF$_{14}$) connected to the bus (BCE) and adapted to be connected to the corresponding second connection means (14) of the back faces of the adapters, and fourth connection means (CORE) adapted to be connected to the second connection means (14) of the back face of an interface cartridge (ADI).

8. A host structure (P) for terminal adaptors (AD-AD$_{14}$, ADI) belonging to a distributed information processing architecture (ARCH), formed of a plurality of information processing systems (SI, SI$_1$, SIS$_j$, SAD, ..., SAD$_j$), each connected by way of communication servers (SERV, SERV$_1$, SERV, SERV$_j$) to a plurality of networks (RE, RE$_1$, ..., RE$_k$) each system being connected to a plurality of synchronous or asynchronous terminals (T$_1$, T$_2$, T$_3$, T$_{m1}$, T$_{m2}$, T$_{m3}$) by way of at least one of the networks (RE) and terminal adaptors (AD, ..., AD$_m$, ..., AD$_j$), each of which is connected on the one hand to said network and on the other to at least one terminal (T$_1$-T$_3$, T$_{m1}$-T$_{m3}$, T-T$_{j3}$) by way of a synchronous or asynchronous transmission link, characterized in that said host structure includes:

a first compartment (CAV) containing a plurality of cartridges (1, AD-AD$_{14}$, ADI) being positioned parallel to one another, each containing a board carrying a terminal adaptor having an electronic circuit, said cartridges being within a housing comprising a base (3) to which the board is fixed, a front face (4), including upper and lower portions having means (7,6) for grasping and locking a corresponding cartridge inside the first compartment (CAV), and a back face (5) perpendicular to the board and to the base (3), said front and back faces including first connection means (8-10) for connection to transmission medium links among input/output terminals associated with an adaptor carried by the board, and second connection means (14) for connection with a specific bus (BEE, BCE$_j$), and a lid (11) for closing the housing, a second compartment (CAR) containing an electrical supply to the boards contained in the first compartment and a ventilation device (VNT) of the structure, the first and second compartments being separated by a backpanel (FP) carrying a copper bus (BCE, BCE$_j$) specific to a network (RE) to which the boards carrying the terminal adaptors are connected, wherein the specific bus (BCE, BCE$_j$) and the network (RE) are of the Ethernet type, the specific bus including three separate tracks (PC, PL$_1$, P$_2$), a central track (PC) for transporting information and being equidistant from two lateral tracks (PL$_1$, P$_2$), said lateral tracks serving to provide a sheathing layer for the central track, each of the tracks being formed by a conductor engraved into the copper, the backpanel (FP) including means (CF-CF$_{14}$, CORE) for connecting the boards to the network (RE) and to the bus (BCE), on the one hand, and to the power supply (ALIM), on the other.

9. The host structure (P) of claim 8, characterized in that the backpanel (FP) includes third connection means (CF-CF$_{14}$) connected to the bus (BCE) and adapted to be connected to the corresponding second connection means (14) of the back faces of the adapters, and fourth connection means (CORE) adapted to be connected to the second connection means (14) of the back face of an interface cartridge (ADI).

10. A host structure (P) for terminal adaptors (AD-AD$_{14}$, ADI) belonging to a distributed information processing architecture (ARCH), formed of a plurality of information processing systems (SI, SI$_1$, SIS$_j$, SAD, ..., SAD$_j$), each connected by way of communication servers (SERV, SERV$_1$, SERV, SERV$_j$) to a plurality of networks (RE, RE$_1$, ..., RE$_k$) each system being connected to a plurality of synchronous or asynchronous terminals (T$_1$, T$_2$, T$_3$, T$_{m1}$, T$_{m2}$, T$_{m3}$) by way of at least one of the networks (RE) and terminal adaptors (AD, ..., AD$_m$, ..., AD$_j$), each of which is connected on the one hand to said network and on the other to at least one terminal (T$_1$-T$_3$, T$_{m1}$-T$_{m3}$, T-T$_{j3}$) by way of a synchronous or asynchronous transmission link, characterized in that said host structure includes:

a first compartment (CAV) containing a plurality of cartridges (1, AD-AD$_{14}$, ADI) being positioned parallel to one another, each containing a board carrying a terminal adaptor having an electronic circuit, said cartridges being within a housing comprising a base (3) to which the board is fixed, a front face (4), including upper and lower portions having means (7,6) for grasping and locking a corresponding cartridge inside the first compartment (CAV), and a back face (5) perpendicular to the board and to the base (3), said front and back faces including first connection means (8-10) for connection to transmission medium links among input/output terminals associated with an adaptor carried by the board, and second connection means (14) for connection to a specific bus (BCE, BCE$_j$), and a lid (11) for closing the housing, said lid (11) having a rectangular shape and a base periphery, including, on a side other than a side in contact with the front face (4) a plurality of sets ($V_i$, $V_j$, $V_k$) of ventilation holes enabling the evacuation of thermal energy given off by the components of the board carrying the adaptor, a second compartment (CAR) containing an electrical supply to the boards contained in the first compartment and a ventilation device (VNT) of the structure, the first and second compartments being separated by a backpanel (FP) carrying a copper bus (BCE, BCE$_j$) specific to a network (RE) to which the boards carrying the terminal adaptors are connected, wherein the specific bus (BCE, BCE$_j$) and the network (RE) are of the Ethernet type, the specific bus including three separate tracks (PC, PL$_1$, PL$_2$), a central track (PC) for transporting information and being equidistant from two lateral tracks (PL$_1$, PL$_2$), said lateral tracks serving to provide a sheathing layer for the central track, each of the tracks being formed by a conductor engraved into the copper, the backpanel (FP) including means (CF-CF$_1$4, CORE) for connecting the boards to the network (RE) and to the bus (BCE), on the one hand, and to the power supply (ALIM), on the other.

11. The host structure (P) of claim 10, characterized in that the backpanel (FP) includes third connection means (CF-CF$_{14}$) connected to the bus (BCE) and adapted to be connected to the corresponding second connection means (14) of the back faces of the adapters, and fourth connection means (CORE) adapted to be connected to the second connection means (14) of the back face of an interface cartridge (ADI).

12. A host structure (P) for terminal adaptors (AD-AD$_{14}$, ADI) belonging to a distributed information processing architecture (ARCH), formed of a plurality of information processing systems (SI, SI$_1$, SIS$_j$, SAD, ..., SAD$_j$), each connected by way of communication servers (SERV, SERV$_1$, SERV, SERV$_j$) to a plurality of networks (RE, RE$_1$, ..., RE$_k$) each system being connected to a plurality of synchronous or asynchronous terminals (T$_1$, T$_2$, T$_3$, T$_{m1}$, T$_{m2}$, T$_{m3}$) by way of at least one of the networks (RE) and terminal adaptors (AD, ..., AD$_m$, ..., AD$_j$), each of which is connected on the one hand to said network and on the other to at least one terminal (T$_1$-T$_3$, T$_{m1}$-T$_{m3}$, T-T$_{j3}$) by way of a synchronous or asynchronous transmission link, characterized in that said host structure includes:

a first compartment (CAV) containing a plurality of cartridges (1, AD-AD$_{14}$, ADI) being parallel to one another, each containing a board carrying a terminal adaptor having an electronic circuit, said ventilation holes are rectangular in shape, their length being perpendicular to an associated side, there being three sides with which the ventilation holes are associated, two of the sides being shorter than the third, and the ventilation holes located on the short sides being identical to one another, cartridges being within a housing comprising a base (3) to which the board is fixed, a front face (4), including upper and lower portions having means (7,6) for grasping and locking a corresponding cartridge inside the first compartment (CAV), and a back face (5) perpendicular to the board and to the base (3), said front and back faces including first connection means (8-10) for connection to transmission medium links among input/output terminals associated with an adaptor carried by the board, and second connection means (14) for connection to a specific bus (BCE, BCE$_j$), and a lid (11) for closing the housing, said lid (11) having a rectangular shape and a base periphery, including, on a side other than a side in contact with the front face (4) a plurality of sets ($V_i$, $V_j$, $V_k$) of ventilation holes enabling the evacuation of thermal energy given off by the components of the board carrying the adaptor, said ventilation holes are rectangular in shape, their length being perpendicular to an associated side, there being three sides with which the ventilation holes are associated, two of the sides being shorter than the third, and the ventilation holes located on the short sides being identical to one another, a second compartment (CAR) containing an electrical supply to the boards contained in the first compartment and a ventilation device (VNT) of the structure, the first and second compartments being separated by a backpanel (FP) carrying a copper bus (BCE, BCE$_j$) specific to a network (RE) to which the boards carrying the terminal adaptors are connected, wherein the specific bus (BCE, BCE$_j$) and the network (RE) are of the Ethernet type, the specific bus including three separate tracks (PC, PL$_1$, PL$_2$), a central track (PC) for transporting information and being equidistant from two lateral tracks (PL$_1$, PL$_2$), said lateral tracks serving to provide a sheathing layer for the central track, each of the tracks being formed by a conductor engraved into the copper, the backpanel (FP) including means (CF-CF$_1$4, CORE) for connecting the boards to the network (RE) and to the bus (BCE), on the one hand, and to the power supply (ALIM), on the other.

13. The host structure (P) of claim 12, characterized in that the backpanel (FP) includes third connection means (CF-CF$_{14}$) connected to the bus (BCE) and adapted to be connected to the corresponding second connection means (14) of the back faces of the adapters, and fourth connection means (CORE) adapted to be connected to the second connection means (14) of the back face of an interface cartridge (ADI).

\* \* \* \* \*

UNITED STATES PATENT AND TRADEMARK OFFICE
CERTIFICATE OF CORRECTION

PATENT NO. : 5,339,220
DATED : August 16, 1994
INVENTOR(S) : CHOTARD et al

It is certified that error appears in the above-indentified patent and that said Letters Patent is hereby corrected as shown below:

Col. 14, line 35 (Claim 1, line 44) "$(PL_1,P_2)$" should be --$(PL_1,PL_2)$--.

Col. 15, line 25 (Claim 6, line 25) "media" should be --medium--.

Col. 16, line 21 (Claim 8, line 31) "$(BEE,BCE_j)$" should be --$(BCE,BCE_j)$--.

Col. 16, line 34 (Claim 8, line 44) "$PL_1,P_2)$" snould be -- $PL_1,PL_2)$--.

Col. 16, line 36 (Claim 8, line 46) "$(PL_1,P_2)$" should be --$(PL_1,PL_2)$--.

Signed and Sealed this

Twentieth Day of December, 1994

Attest:

BRUCE LEHMAN

*Attesting Officer*     *Commissioner of Patents and Trademarks*